United States Patent [19]
Birch et al.

[11] Patent Number: 6,020,026
[45] Date of Patent: Feb. 1, 2000

[54] PROCESS FOR THE PRODUCTION OF A COATING OF MOLECULAR THICKNESS ON A SUBSTRATE

[75] Inventors: William Birch, Samois sur Seine; Alain Robert Emile Carre, Le Chatelet-en-Brie, both of France

[73] Assignee: Corning Incorporated, Corning, N.Y.

[21] Appl. No.: 08/992,405

[22] Filed: Dec. 17, 1997

Related U.S. Application Data

[60] Provisional application No. 60/036,324, Jan. 29, 1997.

[30] Foreign Application Priority Data

Jan. 17, 1997 [FR] France ................................ 97 00488

[51] Int. Cl.⁷ ...................................... B05D 5/00
[52] U.S. Cl. .......................... 427/287; 427/256; 427/429; 427/399
[58] Field of Search ..................... 427/256, 287, 427/429, 261, 275, 399

[56] References Cited

U.S. PATENT DOCUMENTS

| | | | |
|---|---|---|---|
| 4,224,362 | 9/1980 | Ramsauer | 427/256 |
| 4,343,837 | 8/1982 | DeLorenzo | 427/275 |
| 4,443,499 | 4/1984 | Lipp | 427/287 |
| 4,933,120 | 6/1990 | D'Amato et al. | 427/256 |
| 5,198,224 | 3/1993 | Ono et al. | 424/450 |
| 5,512,131 | 4/1996 | Kumar et al. | 156/655.1 |
| 5,718,456 | 2/1998 | Detwiler, II et al. | 283/67 |

FOREIGN PATENT DOCUMENTS

WO 96/29629   9/1996   WIPO .

OTHER PUBLICATIONS

Monolayers of fluorinated silanes as electron–beam resists, Journal of Vacuum Science & Technology, Part B, vol. 14, No. 1, Jan. 1996, p. 69–74.

*Primary Examiner*—Shrive Beck
*Assistant Examiner*—Kirsten A. Crockford
*Attorney, Agent, or Firm*—Thomas R. Beall

[57] ABSTRACT

The invention relates in particular to a process for modifying the properties of a hydroxylated surface of a three-dimensional substrate containing exposed zones and recessed zones, according to which a compound, such as a silane containing (a) reactive group(s), is selectively dry-transferred onto the exposed zones of said surface using a a flat stamping pad impregnated with said compound. The substrate may be made of glass and the compound may be a thiol or an alkyl- or aryl-tri(chloro or alkoxy) silane, inter alia. Use, in particular, for the production of microwell plates for biological cultures and printing plates.

12 Claims, No Drawings

PROCESS FOR THE PRODUCTION OF A COATING OF MOLECULAR THICKNESS ON A SUBSTRATE

This application claims benefit of Ser. No. 60/036,324 Jan. 29, 1997.

FIELD OF THE INVENTION

Background of the Invention

The invention relates to a process for the production of a coating of molecular thickness on a three-dimensional substrate by dry-transfer of a compound having an affinity for said substrate in order to selectively modify the properties of certain parts of which bear a coating produced by the process of the invention.

The application of monomolecular layers of functional silane on solid surfaces by a dry-printing technique has recently been described by P. M. St. John and H. G. Craighead, Appl. Phys. Lett 68(7), pages 1022–1024 (1996). This consists in impregnating a silicone rubber stamping pad with octadecyltrichlorosilane and then in pressing the pad against a flat surface of silicon or of oxides of metals such as Ti and Al. A reaction takes place between the silane and the coated surface such that the silane molecules are bound to the surface via one of their ends. The silane is applied selectively using a stamping pad which bears a mask pattern in relief, produced by photolithography, so as to deposit a mask of silane on the surface treated. This surface is then subjected to chemical etching intended to attack the parts which are not protected by the silane mask.

It is also known to graft silane molecules onto a glass substrate from a liquid solution, for example by immersion, by spraying, etc. The process usually includes a rinsing operation and a drying step.

Although the prior art teaches depositing a chosen pattern on a flat substrate, it does not, however, describe the process aimed at the coating, by dry-printing, of substrates with a complex surface containing relatively high exposed parts and relatively low recessed parts.

The invention is thus aimed at providing such a process which is of great value for certain applications in which an accurate coating of the exposed parts is desired, in particular when one of the sizes of the exposed and/or recessed parts is less than 100 $\mu$m, preferably than 10 $\mu$m, even more preferably than 5 $\mu$m. Indeed, there is to date no known process, which is simple and economical to carry out, allowing the relatively high exposed parts of a substrate with three-dimensional microstructure to be coated selectively and with precision.

The invention thus relates to a process for the production of a coating of molecular thickness on a three-dimensional substrate by dry-transfer of a compound having an affinity for said substrate, wherein a surface of a transfer element is brought in contact with said substrate, said surface of said transfer element being at least partly impregnated with said compound, characterized in that a transfer element whose impregnated surface is flat and uniformly impregnated is placed in contact with a substrate containing relatively high exposed parts and relatively low recessed parts, so as to selectively apply the compound/coating onto the relatively high exposed parts of the substrate, leaving the relatively low recessed parts essentially free of compound.

By the expression "uniformly impregnated surface" it is meant that the surface of the transfer element is substantially uniformly impregnated without local discontinuities, in contrast with what would be the case if said surface was impregnated in a pattern.

The process of the invention may typically be carried out by performing the following steps:
(a) taking a transfer element with a flat surface made of a solid or solid-like material capable of undergoing swelling under the effect of an organic solvent;
(b) preparing a solution, in said organic solvent, of a compound having an affinity for said substrate;
(c) applying said solution to a clean flat surface of said transfer element, then allowing the transfer element to absorb the solution completely;
(d) pressing the surface of the transfer element treated with said solution against a clean substrate of the above-defined type and leaving them in contact until the molecules of said compound are bonded to the surface of the substrate with concomitant formation of a coating of molecular thickness bonded to the relatively high exposed parts of the surface of the substrate; and
(e) separating the transfer element from said substrate.

The transfer element or stamping pad used in the process of invention may be prepared as follows:
(a) taking a transfer element with a flat surface, made of a solid or solid-like material capable of undergoing swelling under the effect of an organic solvent;
(b) preparing a solution, in an organic solvent, of a compound having an affinity for the substrate to be coated; and
(c) applying said solution to a clean flat surface of said transfer element, then allowing the transfer element to absorb the solution completely.

It should be noted that evaporation of the solvent may also take place during the above-mentioned step (c).

By the expression "compound having an affinity for the substrate", it is meant a compound which is capable of bonding to the substrate surface by any mechanism such as, by way of non-limiting examples: by chemical bonding, by attraction of opposite electrical charges, or by hydrogen bonding. By "compound" it is meant any kind of chemical molecules, including polymers and proteins. Preferably, the compound used in the present invention is a compound having a functional group that reacts with groups present on the substrate surface.

Although the invention has a very broad scope and can be practiced with various compounds and substrates, it will be described more particularly in connection with a substrate bearing a hydroxyl group on its surface and with a compound having a functional group reactive with the hydroxyl groups of the substrate and/or hydrolyzable into a group reaction with the hydroxyl group of the substrate, and forming a linkage bonding said compound to said substrate.

According to a preferred specific embodiment, the compound includes groups of two different types; the second type of functional groups not being reactive with a hydroxyl group, in contrast with the first type.

The compound having a functional group reactive with the hydroxyl group of the substrate and/or hydrolyzable into a group reactive with said hydroxyl group can be, in particular, a silane.

The transfer element may be made of any solid or solid-like material capable of undergoing swelling under the action of an organic solvent. This may be, for example, a rubber such as a silicone, polyisoprene, polybutadiene or polychloroprene rubber; butadiene-styrene, butadiene-acrylonitrile, ethylene-propylene or ethylene-vinyl acetate elastomeric copolymers; butyl rubber, polysulfide rubber, etc. A silicone rubber is preferred at the present time.

The organic solvent may be any solvent capable of dissolving the compound and of exerting a swelling effect on the material of the transfer element. Mention may be made, for example, of liquid alkanes such as hexane, heptane, octane, decane and hexadecane; halogenated alkanes such as chloroform, aromatic compounds such as benzene or toluene; petroleum fractions such as white spirit, diesel oil, gasoline and other solvents such as tetrahydrofuran, N-methylpyrrolidone, etc. Indeed, most organic solvents may be suitable for the invention and a simple routine test, which is within the scope of a person skilled in the art, will make it possible to check the usefulness of a given solvent. It should moreover be noted that the organic solvent does not need to be a good solvent for the compound since only very dilute compound solutions are usually, but not always, used, for example millimolar solutions. The reason for this is that the amount of compound required to form a self-assembled monomolecular layer is very low, of the order of 1 g of compound per 1,000 m$^2$ of substrate surface. It therefore suffices to impregnate the transfer element with small amounts of compound and, for this, very dilute compound solutions are sufficient.

The compound may contain one or more functional groups of identical or different nature, the only condition being that at least one of these groups is reactive, and/or is hydrolyzable into a group which is reactive, with the hydroxyl groups present on the surface of the substrate.

One class of compounds which can be used in the invention is that of the silanes of the general formula $R_n$—Si—$X_{4-n}$, where R is a functional or nonfunctional group, which is not reactive with a hydroxyl group; X is a group which is reactive, and/or which is hydrolyzable into a group which is reactive, with a hydroxyl group, and n=1, 2 or 3. For example, R may be an alkyl, partially or totally fluorinated alkyl, alkenyl or substituted or unsubstituted aryl radical, an expoxide group or a radical containing the epoxide group, an acrylyl group or a radical containing the acrylyl group, a methacrylyl group or a radical containing the methacrylyl group, a mercaptan group or a radical containing the mercaptan group, inter alia. X may be, for example, a chlorine atom or an alkoxy group, such as methoxy and ethoxy, inter alia.

Specific examples of silanes which can be used in the invention are, in particular, octadecyltrichlorosilane, phenyltrichlorosilane, phenyltriethoxysilane, perfluorodecyltrichlorosilane, triethoxyvinylsilane, mercaptopropyltrimethoxysilane and phenyltriethoxysilane, to mention only a few.

It should be noted that when the silane contains three hydrolyzable groups, such as halo or alkoxy groups, in its molecule, one of them reacts with an —OH group of the substrate and the other two are capable of forming, by hydrolysis and condensation, siloxane crosslinks between neighboring molecules in the coating. It should be noted, however, that it is thought that these crosslinks do not extend continuously throughout the coating but rather that a plurality of islets are formed in which the molecules are bonded to each other.

The substrate may be any material whose surface bears hydroxyl groups. Mention may be made, for example, of glass, silica, metals, or polymers whose surface has been modified to create hydroxyl groups thereon, for example by a chemical oxidizing treatment or with a plasma, or alternatively coated with a layer of glass, silica or metal by techniques such as sputtering, chemical deposition in the vapor phase, or sol gel.

The substrate may have varied three-dimensional forms, including complex forms such as a network of pins perpendicular to a support or a grid in relief. They may also bear a pattern produced, for example, by molding, etching through a mask, photolithography, x-ray lithography, etc. Also, the surface of the substrate may be smooth, coarse, modeled or porous.

The surface of the transfer element must be clean when step (c) is carried out. Similarly, the substrate to be treated must be clean at the moment of transfer. Many cleaning processes are known in the art and described in the published literature. The surface of the transfer element may be cleaned, for example, by repeated ultrasonication in a bath of ethanol, whereas the substrate may be cleaned in an acidic oxidizing bath such as a sulfochromic bath. Another useful process, described in French patent application No. 96/10627 filed by the Applicant on Aug. 30, 1996, consists of immersing the article to be cleaned in concentrated aqueous hydrogen peroxide solution, for example a solution at a concentration of 30–50% by weight, which is destabilized or decomposed with a suitable catalyst (ferric chloride for example) to generate nascent oxygen which oxidizes the organic contaminants, and then in rinsing and drying the article. Yet another cleaning process, also described in the above-mentioned application, consists of heating the article to be cleaned at a temperature of at least 300° C. for a few tens of minutes. The latter process can, obviously, only be applied to articles which can withstand the treatment temperature. If the cleaned article has to be stored before the transfer operation, it is convenient to protect it from soiling, for example, with a protective film or layer.

The compound solution may be applied to the transfer element (also referred to as the stamping pad hereinbelow) in various ways, for example by rubbing an absorbent paper soaked with the solution onto the transfer element, by rubbing a porous material, such as a sponge, soaked with the solution onto the transfer element, by applying the solution using a doctor blade or an airblade, a sprayer or a coating roller.

The process of the invention may be used to impart to the relatively high exposed parts of the surface of the substrate, containing hydroxyl groups, at least one property chosen from the group consisting of the properties of wettability with water (hydrophillie), non-wettability (hydrophobie), adhesion or anti-adhesion to a material or to particles, low friction, resistance to scratching, protection against contamination, capacity to bond chemically with other molecules, adhesion or anti-adhesion to proteins or biological cells, catalytic properties, and properties of biocompatibility, inter alia; the properties imparted depending, obviously, on the specific compound used and, where appropriate, on the other molecules which will be bonded to it thereafter.

The production of nonwettable surfaces is a significant embodiment of the present invention. The non-wettability may be obtained, in particular, using amphophilic silanes, such as, for example, an alkyltrichlorosilane, for instance octadecyltrichlorosilane; a perfluoroalkyltrichlorosilane for instance perfluorodecyltrichlorosilane; or on aryltrichlorosilane, for instance phenyltrichlorosilane.

One application example which takes advantage of the formation of surfaces which are not wettable with water by the process of the invention is the production of improved microwell plates for cell cultures. These plates contain a plurality of microwells (relatively low recessed parts) formed in a glass plate and separated from each other by relatively high exposed parts. The transition between the wells and the surrounding parts may occur abruptly or, better still, be formed by intermediate zones with a curved profile, such as in the case of those sold under the brand name "Pixwell" by the Applicant.

By using the process of the present invention, it is possible to form on the exposed upper separating zones and, possibly, on the high part of the intermediate zones of the plate, a coating of molecular thickness which makes these zones nonwettable with water while at the same time leaving the lower recessed zones (that is to say the microwells) and the low portion of the intermediate zones noncoated, by using a flat transfer element, for example one made of rubber, which, when pressed against the microwell plate, will transfer silane only onto the upper exposed zones of the plate surrounding and separating the microwells, and, where appropriate, an upper part of the intermediate transition zones. The position of the boundary between the coated and noncoated zones may moreover be controlled by using, to form the transfer element, a more of less hard rubber and/or by applying a more or less large pressure to element during the transfer. Owing to the fact that a chemical bond forms between the silane and the substrate, the silane deposited does not tend to migrate and a very sharp boundary is obtained between the coated zones and the noncoated zones. An improved plate containing a plurality of microwells separated from each other by hydrophobic zones is thus obtained. Accordingly, when the plate is immersed vertically into an aqueous medium, the medium does not wet the coated zones and confines itself to the microwells.

Other applications of the invention are the production of a substrate capable of generating a controlled network of neurons, by using a three-dimensional network of wells connected by channels, the wells being intended to receive and grow cells, these cells propagating in the channels until they meet up and connect with each other. With this aim, the wells and channels are coated with a substance having affinity for the cells, whereas the upper parts separating the channels and surrounding the wells are coated with a hydrophobic coating by the process of the invention; this coating having no affinity for the cells.

The invention is also useful for the production of printing plates as described later.

Another class of compounds which can be used in the invention is that of thiols having the general formula R'—SH where R' is an alkoyl radical, for example, hexadecyl radical. These thiols can react with and bond to the surface of noble metals, for example gold or silver, thereby imparting hydrophobic properties thereto.

The non-limiting examples which follow are given for the purpose of illustrating the invention.

EXAMPLE 1

This example describes the transfer of a silane onto a glass surface using a rubber stamping pad, in order to form a coating of molecular thickness which is chemically bonded to the glass surface and intended to impart properties of nonwettability with water to this surface.

A) Preparation of the Rubber Stamping Pad:

To begin with the two constituent parts (polymer and crosslinking agent) of a polydimethylsiloxane-based silicone elastomer composition sold by the company Dow Corning under the name Sylgard 184 were mixed together, in a weight ratio of 90:10, by stirring for 10 min. After this time, the composition obtained was poured onto a rectangular sheet of 22 cm×26 cm×3 mm cut from a sheet of smooth glass, coated beforehand with an ultrathin anti-adhesive layer consisting of perfluorodecyltrichlorosilane molecules grafted onto the glass surface, so as to form a layer about 2.5 mm in thickness. The edges of the glass sheet were fitted with plastic borders to prevent overspilling and wastage of the crosslinkable silicone composition. The coated sheet was then placed horizontally in a chamber under vacuum and degassed for 3–5 hours. After degassing, the sheet coated with the degassed silicone composition was placed in an oven in order to cure the composition into an elastomer. The heating program consisted in heating from 20 to 100° C. for one hour and then in allowing the oven to cool to room temperature (about 2 hours). The sheet bearing the cured layer was taken from the oven, cut at a distance of about 1 cm from the plastic edges (the layer was not suitably cured close to the edges), and the central part of the layer of silicone rubber was detached from the glass sheet and cut to the desired sizes for the transfer stamping pad, i.e. the size of the substrate. The flat elastomer stamping pad was then rinsed in three successive baths of ethanol, with a 5 min. ultrasound treatment in each bath. After the final rinsing with ethanol, the stamping pad was dried with a jet of dry nitrogen and placed on a sheet of corrugated glass, with the side (referred to hereinbelow as side A), which had been in contact with the glass sheet, facing upwards (for reasons of cleanliness). The assembly was placed in an oven at 60° C. for 30 minutes in order to dry the silicone elastomer stamping pad. After cooling to room temperature, the stamping pad was ready for the following operation, that is to say the impregnation of "inking" with the silane.

B) Inking of the Stamping pad with the Silane and Printing of a Substrate.

An inking solution was prepared by dissolving 50 microliters of octadecyltrichlorosilane (supplied by the company Fluorochem Ltd.) in 2 grams of hexane which had been dried beforehand using a molecular sieve. This solution, referred to hereinbelow as the "ink", should be used within 3 hours of preparation. Side A of the stamping pad was then inked by covering it with a sheet of absorbent paper (Joseph paper, for example) folded into four, on which sheet were placed a few drops of ink. The folded sheet of absorbent paper was then rubbed on side A for about 10 seconds and was then removed. The stamping pad was left to dry in the air for about 20 minutes (drying time). Side A of the stamping pad was then placed against a glass microwell plate of the "Pixwell" brand sold by the company Corning Inc. The two elements were placed in contact, under moderate pressure, and then left for about 10 minutes (transfer or printing time), after which the stamping pad was removed. A hydrophobic coating of molecular thickness having a contact angle with water of 100–110° was thus formed on the plate. This is very close to the results obtained with a hydrophobic monolayer formed by the standard solution coating procedure which gave a contact angle of 107–112°.

The coating obtained was chemically bonded to the "Pixwell" plate and was not soluble in most organic solvents and aqueous media, except for concentrated caustic soda solutions.

The plate was then immersed in a bath of aqueous polylysine solution. After removal from the bath, the plate was dried and examined. The plate contained a coating of polylysine only on the walls of the microwells which had not been precoated. This polylysine coating is intended to impart a specific affinity for certain biological substances to the zones of the microwells. It should be noted that a coating of aminopropyltrichazisilane could be substituted for the polylysine coating.

EXAMPLE 2

Following the general procedure of Example 1, except that the octadocyltrichlorosilane was replaced by phenyltrichlorosilane and the drying and printing times were 10 min. and 1 min. respectively, a coating was produced having a representation similar to that of the coating produced in Example 1.

EXAMPLE 3

In place of alkyltrichlorosilanes, alkoxysilanes were used, namely methacryloxypropyltrimethoxysilane (A 174 from Dow Corning), triethoxyvinylsilane, mercaptopropyltrimethoxysilane and phenyltriethoxysilane, to produce coating by a procedure similar to that of Example 1, except that the silane solution was prepared by adding 50 ml of silane to 2 g of a solution prepared by mixing 80 parts by weight of tetrahydrofuran and 10 parts by weight of aqueous 0.1 N hydrochloric acid solution, and then leaving to stand at room temperature for at least 10 hours so that the alkoxy groups are hydrolyzed into —OH groups.

The drying time was 45 min. and the printing time was 10 min. The coatings obtained imparted to the substrates properties of wettability toward inks which can be polymerized by UV irradiation.

EXAMPLE 4

The dry-transfer of silane molecules is useful for improving the performance of an imaging plate for the printing of colored points by a typography process. In a typography process, the printing shapes are in relief and during the step of inking of the typography plate, the ink sits at the top of the parts in relief representing the pattern to be printed.

In order to increase the printing precision and to facilitate its implementation, it was found to be advantageous to make the top of the parts in relief wettable with the ink, the rest of the typography plate being made, in contrast, nonwettable by the ink. The typography plate thus has two surfaces of different nature, one which is ink-wettable—the tope of the parts in relief, the other being nonwettable—bottom of the relief and side of the relief. Thus, during inking of the typography plate, the ink naturally distributes itself at the tops of the printing zones.

The process described in the invention makes it possible to apply a coating of molecular thickness of octadecyltrichlorosilane (OTS) or of phenyltrichlorosilane (PTS), for example, only at the top of the printing parts of a typography plate intended to be inked with a solvent-free ink, which can be photopolymerized by UV rays, having a surface tension of 25–30 mN/m, and which is capable of wetting the OTS or PTS coating. The rest of the plate is made nonwetting toward the ink by coating the plate by immersion into a solution of fluorodecyl-1I, 1II, 2H, 2H-trichlorosilane—(FDS). The result satisfied the aim, that is to say that the top of the printing parts consists of a coating of OTS or PTS, the rest being coated with FDS. One of the functions of the OTS or PTS coating is also to prevent the grafting of the second nonwetting silane, the FDS, onto the top of the relief.

This method makes it possible to produce typography printing plates which have a printing pattern size of between 10 and a few hundred $\mu$m. Since the silanes used (OTS or PTS, FDS) have a high chemical affinity for silica, the technique is particularly suitable for imaging plates consisting of silica or coated with silica.

The use of the dry-transfer of molecules, in particular silanes, has thus made it possible to produce typography plates which allow the printing with precision of colored points; the size of the printed patterns may be reduced to a few tens of $\mu$m by controlling, by the process of the invention, the wettability of the printing shapes.

It goes without saying that the embodiments described are only examples and that they may be modified, in particular by substitution of technical equivalents, without thereby departing from the scope of the invention.

What is claimed:

1. A process for the production of a coating on a substrate by dry transfer of a compound having an affinity for said substrate, wherein a surface of a transfer element is brought in contact with said substrate, said surface of said transfer element being at least partly impregnated with said compound, characterized in that a transfer element whose impregnated surface is flat and uniformly impregnated is placed in contact with a substrate containing a three-dimensional surface topography consisting of relatively high exposed parts and relatively low recessed parts whereby said exposed parts and said recessed parts differ in height by less than approximately 100 $\mu$m, so as to selectively apply the compound/coating onto the relatively high exposed parts of the substrate, leaving the relatively low recessed parts essentially free of compound, wherein said compound comprises a reactive functional group, and/or hydrolyzable reaction group, which reacts with groups present on the substrate surface, and reacting said functional and/or hydrolyzable group with said groups present on the substrate surface.

2. The process as claimed in claim 1, wherein the transfer element is made of rubber.

3. The process as claimed in claim 2, wherein the rubber is a silicone rubber.

4. The process as claimed in claim 1, wherein said substrate surface has hydroxyl groups.

5. The process as claimed in claim 4, wherein said compound comprises a functional group reactive with the hydroxyl groups of the substrate and/or hydrolyzable into a group reactive with the hydroxyl groups of the substrate.

6. The process as claimed in claim 4, wherein the compound is a silane of the general formula $R_n$—Si—$X_{4-n}$ where R is a functional or nonfunctional group, which is not reactive with a hydroxyl group; X is a group which is reactive, and/or which is hydrolyzable into a group which is reactive, with a hydroxyl group, and n=1, 2 or 3.

7. The process as claimed in any one of claims 1 to 6, wherein the compound applied imparts at least one property chosen from the group consisting of the properties of wettability with water (hydrophillie), non-wettability (hydrophobie), adhesion or anti-adhesion to a material or to particles, low friction, resistance to scratching, protection against contamination, capacity to bond chemically with other molecules, adhesion or anti-adhesion to proteins or biological cells, catalytic properties, and properties of biocompatibility.

8. The process as claimed in claim 1 wherein the substrate has a three-dimensional microstructure.

9. The process as claimed in claim 4, wherein the substrate is chosen from the group consisting of glass, silica, metals, polymers with a hydroxylated surface, and polymers coated with a layer of glass, silica or metal.

10. The process as claimed in claim 1, wherein said compound is a thiol of the general formula R'—SH where R' is an alkyl group, and said substrate is a noble metal.

11. The process of claim 1 wherein said exposed parts and said recessed parts differ in height by less than approximately 10 $\mu$m.

12. The process of claim 1 wherein said exposed parts and said recessed parts differ in height by less than approximately 5 $\mu$m.

* * * * *